(12) United States Patent
Kluftinger et al.

(10) Patent No.: US 12,061,210 B2
(45) Date of Patent: Aug. 13, 2024

(54) WHEEL SPEED SENSOR FOR A UTILITY VEHICLE

(71) Applicant: Knorr-Bremse Systeme Fuer Nutzfahrzeuge GmbH, Munich (DE)

(72) Inventors: Andre Kluftinger, Kleinheubach (DE); Andreas Windisch, Unterhaching (DE); Klaus Lechner, Pretzfeld (DE); Pravin Jawarikar, Distr. Buldhana (IN); Michael Hauff, Munich (DE); Tobias Rohse, Schwieberdingen (DE)

(73) Assignee: KNORR-BREMSE SYSTEME FUER NUTZFAHRZEUGE GMBH, Munich (DE)

( * ) Notice: Subject to any disclaimer, the term of this patent is extended or adjusted under 35 U.S.C. 154(b) by 193 days.

(21) Appl. No.: 17/596,042

(22) PCT Filed: Jun. 4, 2020

(86) PCT No.: PCT/EP2020/065452
§ 371 (c)(1),
(2) Date: Dec. 2, 2021

(87) PCT Pub. No.: WO2020/245254
PCT Pub. Date: Dec. 10, 2020

(65) Prior Publication Data
US 2022/0317143 A1 Oct. 6, 2022

(30) Foreign Application Priority Data
Jun. 6, 2019 (DE) ..................... 10 2019 115 397.2

(51) Int. Cl.
*G01P 3/487* (2006.01)
*G01D 5/14* (2006.01)
(Continued)

(52) U.S. Cl.
CPC .............. *G01P 3/487* (2013.01); *G01D 5/142* (2013.01); *G01P 1/026* (2013.01); *G01R 33/072* (2013.01)

(58) Field of Classification Search
USPC ......................................................... 324/174
See application file for complete search history.

(56) References Cited

U.S. PATENT DOCUMENTS

| 6,155,114 A | 12/2000 | Karino et al. |
| 6,334,361 B1 | 1/2002 | De Volder et al. |

(Continued)

FOREIGN PATENT DOCUMENTS

| DE | 202013011157 U1 | 2/2014 |
| JP | 2004-351802 A | 12/2004 |

(Continued)

OTHER PUBLICATIONS

International Search Report for PCT/EP2020/065452 Issued Jul. 22, 2020.

*Primary Examiner* — Vincent Q Nguyen
(74) *Attorney, Agent, or Firm* — NORTON ROSE FULBRIGHT US LLP; Gerard A. Messina

(57) ABSTRACT

A wheel-speed sensor (WSS), including: an active pulse-sensor (PS) having a detection-direction (DD), and a housing for the PS; a movement of a pulse-generator in the DD is detectable by the PS; the WSS has an axis and axis direction (AD) defined to be aligned perpendicularly to the DD; the housing has first/second-components, the first-component (FC) being enclose-able and to which the FC is connectable; the PS is on the FC; the WSS has a radial-cable-outlet (RCO), aligned radially to the axis to lead a cable out; the RCO integrally formed with the second-component (SC) so that the cable is led in a different direction; the FC has a first-region (FR), and the SC has a second-region (SR), the FR-contour-circumference having a (Continued)

shape-feature in predetermined-angle (PA) steps around the axis, so that an FC orientation is definable in the PA steps to provide a PA around the axis.

5 Claims, 8 Drawing Sheets

(51) Int. Cl.
  *G01P 1/02*      (2006.01)
  *G01R 33/07*     (2006.01)

(56) References Cited

U.S. PATENT DOCUMENTS

| | | | |
|---|---|---|---|
| 2004/0119465 A1* | 6/2004 | Clark | ............... G01D 11/30 |
| | | | 324/207.2 |
| 2008/0187614 A1 | 8/2008 | Babin | |
| 2011/0061810 A1* | 3/2011 | Ganguly | ............ H01L 21/0223 |
| | | | 156/345.27 |
| 2019/0101563 A1* | 4/2019 | Endres | ................ G01R 33/07 |

FOREIGN PATENT DOCUMENTS

| | | |
|---|---|---|
| JP | 2007-101230 A | 4/2007 |
| JP | 2011-525631 A | 9/2011 |
| JP | 2017-111002 A | 6/2017 |
| JP | 2018-128322 A | 8/2018 |
| KR | 100931126 B1 | 12/2009 |
| KR | 20100062613 A | 6/2010 |
| WO | 2017178215 A1 | 10/2017 |

\* cited by examiner

WHEEL SPEED SENSOR FOR A UTILITY VEHICLE

FIELD OF THE INVENTION

The invention relates to a wheel speed sensor for a utility vehicle, in particular a wheel speed sensor for a utility vehicle which is arranged in the region of a brake of a wheel on a chassis of the utility vehicle.

BACKGROUND INFORMATION

It is believed to be necessary to detect wheel speeds of individual wheels of vehicles to enable a function of assistance systems, for example, ABS, ASR, or ESP. An accurate detection is necessary to activate appropriate algorithms in borderline situations. To detect the wheel speeds accurately, wheel speed sensors are known which are arranged in the region of a wheel of the vehicle to detect the speed as directly as possible, without deviations due to a mechanical transmission.

In the passenger vehicle field, active wheel speed sensors are increasingly being used, which already generate signals in the wheel speed sensor, which have, for example, a speed-independent constant amplitude. Therefore, a data protocol is already generated in the wheel speed sensor which, for example, transmitted via a bus system, can be evaluated in a control unit. In addition, there is the possibility of implementing diagnostic functions. However, a use of active wheel speed sensors has heretofore not been possible in the utility vehicle field, since a thermal stress of the sensor is greater here in the region of the wheel than in the passenger automobile field and in particular chips of Hall sensors do not withstand the thermal stress.

For this reason, among others, AMR sensors, which have a chip having an "anisotropic magnetoresistive" effect, are used for the active wheel speed sensors. However, the AMR sensors have the disadvantage in relation to the Hall sensors that they only have a specific detection direction, in which a movement of a pulse generator can be detected, whereas conventional Hall sensors are not restricted to a specific detection direction, but rather can detect a movement in any direction. It is therefore necessary in the case of the use of AMR sensors to install the wheel speed sensors in a predetermined orientation in the vehicle.

Due to restrictions of the installation space, however, it is necessary in the case of wheel speed sensors having an elongated shape not to provide a cable outlet axially at one end of the wheel speed sensor, but rather to provide a radial cable outlet. However, the problem exists here that the cable outlets of the wheel speed sensors have to be provided in different angle positions in dependence on the available installation space with respect to an orientation of the AMR sensor. This makes the manufacturing more expensive, since in the case of wheel speed sensors, the housing of which is produced in a casting method, for example, different tools are required for the wheel speed sensors having the cable outlets at different angle positions.

SUMMARY OF THE INVENTION

The invention is thus based on the object of remedying the above disadvantage and providing a wheel speed sensor which can also be used in a region having a higher thermal stress in a restricted installation space.

The object may be achieved by a wheel speed sensor as described herein and a method as described herein. Advantageous refinements are contained in the further descriptions herein.

According to one aspect of the invention, a wheel speed sensor for a utility vehicle has an active pulse sensor having a predetermined detection direction and a housing which is configured to at least partially enclose the pulse sensor. A movement of a pulse generator in the predetermined detection direction is detectable by the pulse sensor, and the wheel speed sensor has an axis, wherein a direction of the axis is defined so that it is aligned perpendicularly to the detection direction of the pulse sensor. The housing has a first component and a second component, by which the first component can be at least partially enclosed, and to which the first component is at least partially connectable in a formfitting manner. The pulse sensor is fastened on the first component and the wheel speed sensor has a radial cable outlet which is aligned radially to the axis of the wheel speed sensor and which leads a cable out of the wheel speed sensor, wherein the radial cable outlet is formed integrally with the second component, so that the cable is led out in a different direction than in the direction of the axis of the wheel speed sensor. The first component has a first region in the direction of the axis which has a contour other than a rotationally-symmetrical contour on its circumference, and the second component has a second region, the inner contour of which is formed at least partially complementary to the contour on the circumference of the first region, and the contour on the circumference of the first region has a shape feature in each of predetermined angle steps around the axis of the wheel speed sensor, so that the first component is formed so that during a connection, an orientation of the first component in relation to the second component is definable in the predetermined angle steps around the axis to provide a predetermined angle around the axis between the detection direction of the pulse sensor and the radial cable outlet.

The active pulse sensor is a sensor which detects pulses which are generated by a change of a magnetic field in a detection region of the sensor. The change of the magnetic field in the region of the sensor takes place either by introducing a magnetic body, for example, a rotating pole wheel having permanent magnets attached thereon, into the detection region or by changing a stationary magnetic field in the region of the sensor. The stationary magnetic field is changed by introducing a ferromagnetic body into the detection region. A pulse wheel, which has teeth and gaps on the circumference, is moved in the detection region of the sensor for this purpose and the change of the magnetic field due to the teeth and gaps moving through the detection region is detected. In this case, both a transition from a tooth to a gap and also a transition from a gap to a tooth can be detected.

By way of such a wheel speed sensor, it is possible to produce wheel speed sensors variably, for example, in a second component casting tool for the second component, having different angle assignments between the detection direction of the pulse sensor and the radial cable outlet.

In one advantageous refinement of the wheel speed sensor, the pulse sensor has an AMR sensor.

The AMR sensor offers a high resolution and a high accuracy. In addition, it is relatively insensitive to oil, dirt, and ambient temperatures in comparison to other sensors.

According to one advantageous refinement of the wheel speed sensor, the first component is configured as a plastic molded part and the second component is formed by extrusion coating the first component using a plastic.

Since the housing of the wheel speed sensor is formed by the extrusion coating of the first component using the plastic which forms the second component, such a wheel speed sensor is producible cost-effectively.

In a further advantageous refinement of the wheel speed sensor, the first component and the second component comprise an identical material.

Such a wheel speed sensor has the advantage that a coefficient of thermal expansion of the materials of the first and second component is equal, so that in the event of thermal stress, an occurrence of internal tensions in the housing of the wheel speed sensor is minimized.

According to a further advantageous refinement of the wheel speed sensor, the predetermined angle steps are in a range of 80° to 100°, particularly at 90°.

One production option for wheel speed sensors having such a grid always offers, for typical applications, a suitable angle assignment between the detection direction of the pulse sensor and the radial cable outlet.

In a further advantageous refinement of the wheel speed sensor, the predetermined angle steps are in a range of 40° to 50°, particularly at 45°.

One production option for wheel speed sensors having such a grid offers, for applications having particularly restricted installation space, a suitable angle assignment between the detection direction of the pulse sensor and the radial cable outlet.

According to a further aspect of the invention, a method has the following steps: Providing a preinstallation assembly, which has the first component, the pulse sensor, and the cable preinstalled, in a second component casting tool for producing the second component including the radial cable outlet; orienting the first component in the casting tool by introducing one of the shape features into a corresponding counter shape feature of the second component casting tool so that a desired predetermined angle is defined between the pulse sensor and the radial cable outlet around the axis of the wheel speed sensor; extrusion coating the first component and the cable, so that the second component having the radial cable outlet is produced around the first component.

By way of such a method, it is possible to produce wheel speed sensors having different angle assignments between the detection direction of the pulse sensor and the radial cable outlet variably in a single casting tool for the second component.

According to a further advantageous refinement of the method, it contains additional steps for producing the preinstallation assembly: extrusion coating busbars in a first component casting tool; connecting the cable to the busbars; connecting the pulse sensor to the busbars.

Using these steps, it is possible to fix and connect functional parts of the wheel speed sensor in a preinstallation assembly cost-effectively, wherein the preinstallation assembly can then be extrusion coated once again cost-effectively to protect the functional parts.

The invention is explained hereinafter on the basis of an exemplary embodiment with reference to the attached drawings.

BRIEF DESCRIPTIONS OF THE DRAWINGS

DETAILED DESCRIPTION

Figure 1:
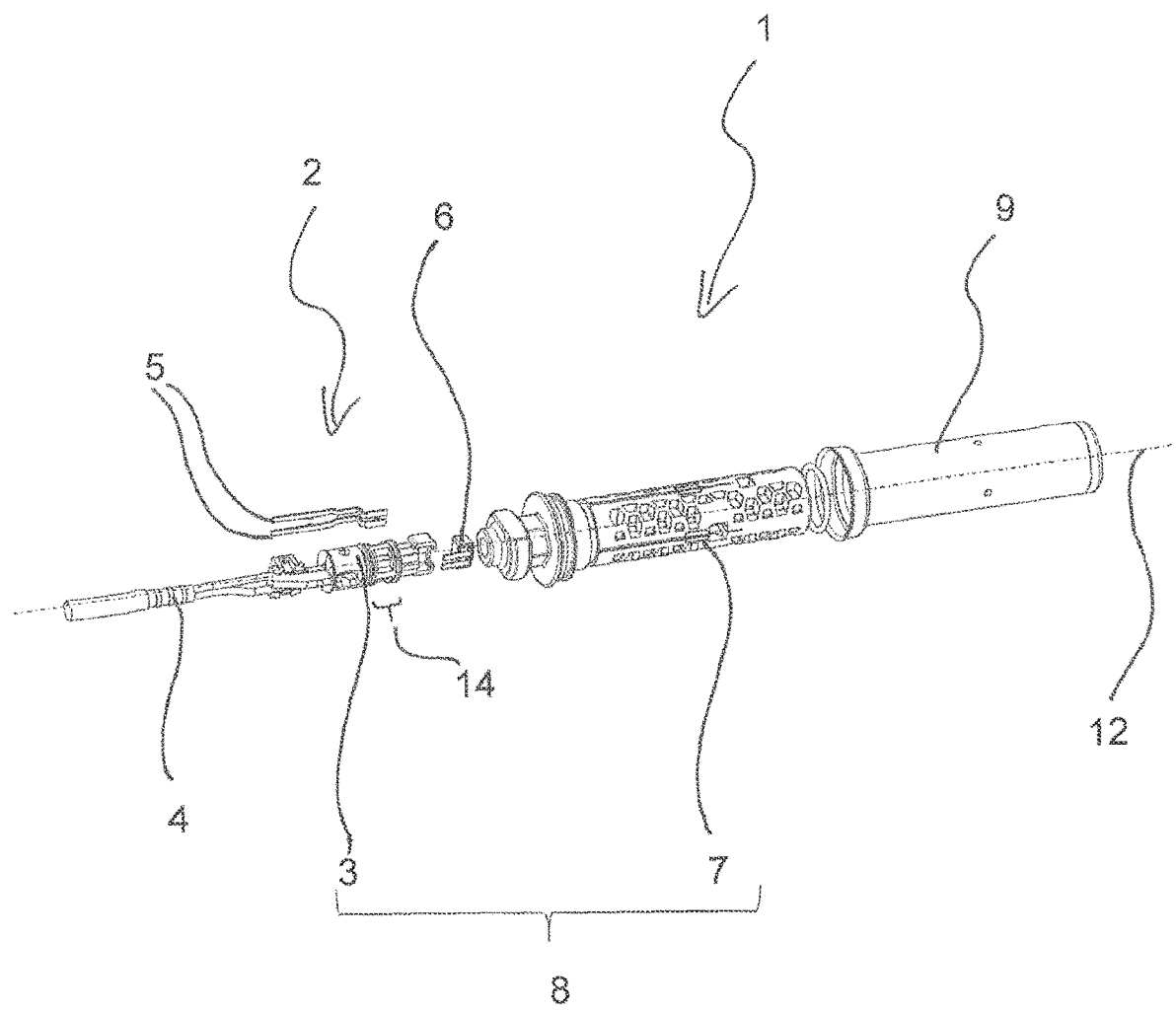
FIG. 1 shows an exploded illustration of an exemplary embodiment of a wheel speed sensor according to the invention.

FIG. 1 shows an exploded illustration of a wheel speed sensor 1 according to the invention. The wheel speed sensor 1 has a preinstallation assembly 2.

The preinstallation assembly 2 has a first component 3, a cable 4, busbars 5, and an active pulse sensor 6, which is fastened on the first component 3.

The pulse sensor 6 has a predetermined detection direction, in which a movement of a pulse generator is detectable. This is based on the effect that an electrical resistance of the pulse sensor is dependent on the presence of a magnetic field and in particular on a direction of the magnetic field. The pulse sensor 6 has an AMR sensor. In an alternative embodiment, the pulse sensor 6 is provided with another sensor having a predetermined detection direction, for example, an active Hall sensor.

The first component 3 is produced by a casting process, in which the busbars 5 are embedded in the first component 3, so that the first component 3 is formed as a plastic molded part. The first component 3 has a first region 14 in the direction of an axis 12 defined hereinafter in conjunction with FIG. 4 and FIG. 5.

The cable 4 and the pulse sensor 6 are mechanically and electrically connected to the busbars 5 embedded in the first component 3.

To produce the second component 5 around the preinstallation assembly 2, the preinstallation assembly 2, and thus the first component 3, is extrusion coated using a plastic. The second component 7 encloses the pulse sensor 6 partially, encloses the first component 3 completely, and is connected to the first component 3 in a formfitting manner. The first component 3 and the second component 7 comprise an identical material and form a housing 8 of the wheel speed sensor 1.

In an alternative embodiment, the housing 8 is constructed from other components, wherein the housing 8 completely or partially encloses the pulse sensor 6. In a further alternative, the first component 3 is not completely enclosed by the first component 7 or does not comprise the same material.

Furthermore, the wheel speed sensor 1 has a protective cap 9, which partially covers the housing 8.

Figure 2:
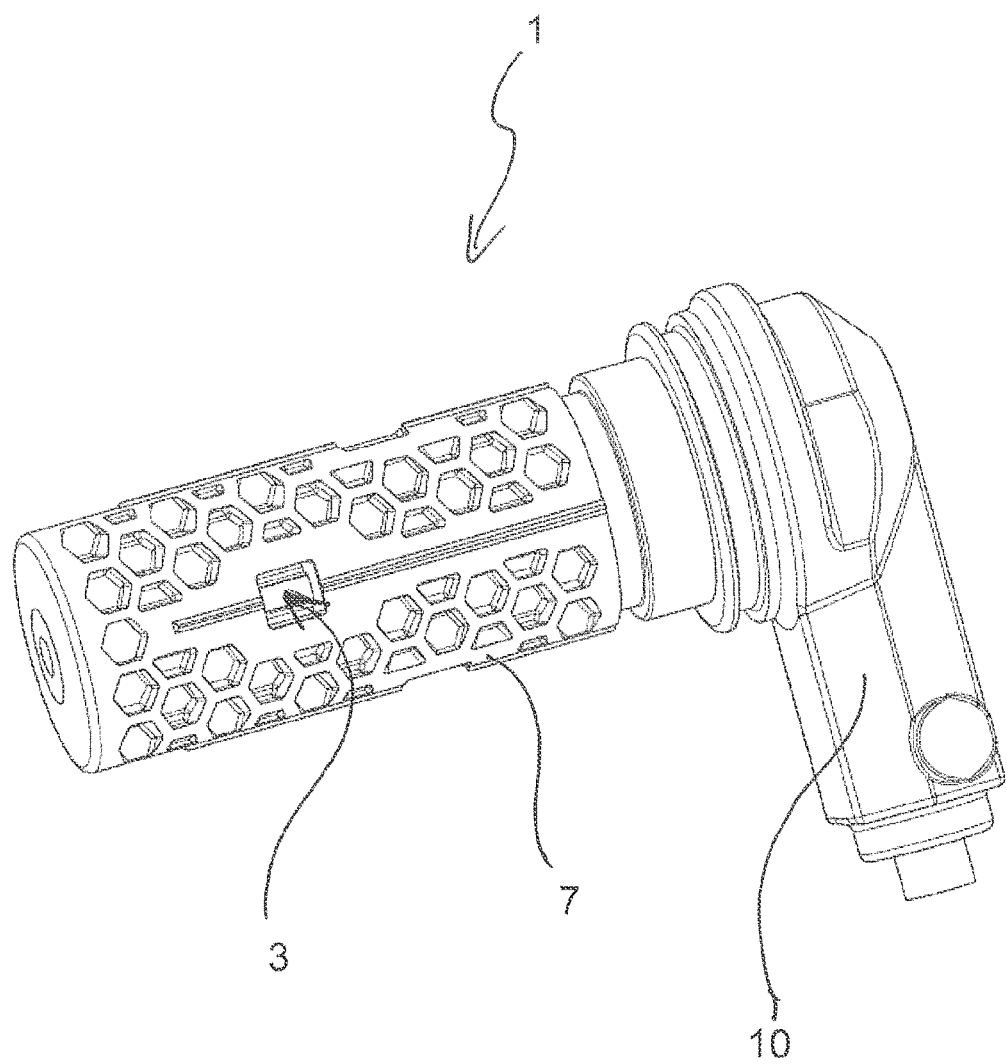
FIG. 2 shows an illustration of a first component of the wheel speed sensor extrusion coated using the second component having radial cable outlet.

FIG. 2 shows an illustration of the first component 3 of the wheel speed sensor 1 extrusion coated using the second component 7 having radial cable outlet 10, wherein the cable outlet 10 is configured to lead the cable 4 out of the wheel speed sensor 1.

Figure 3:
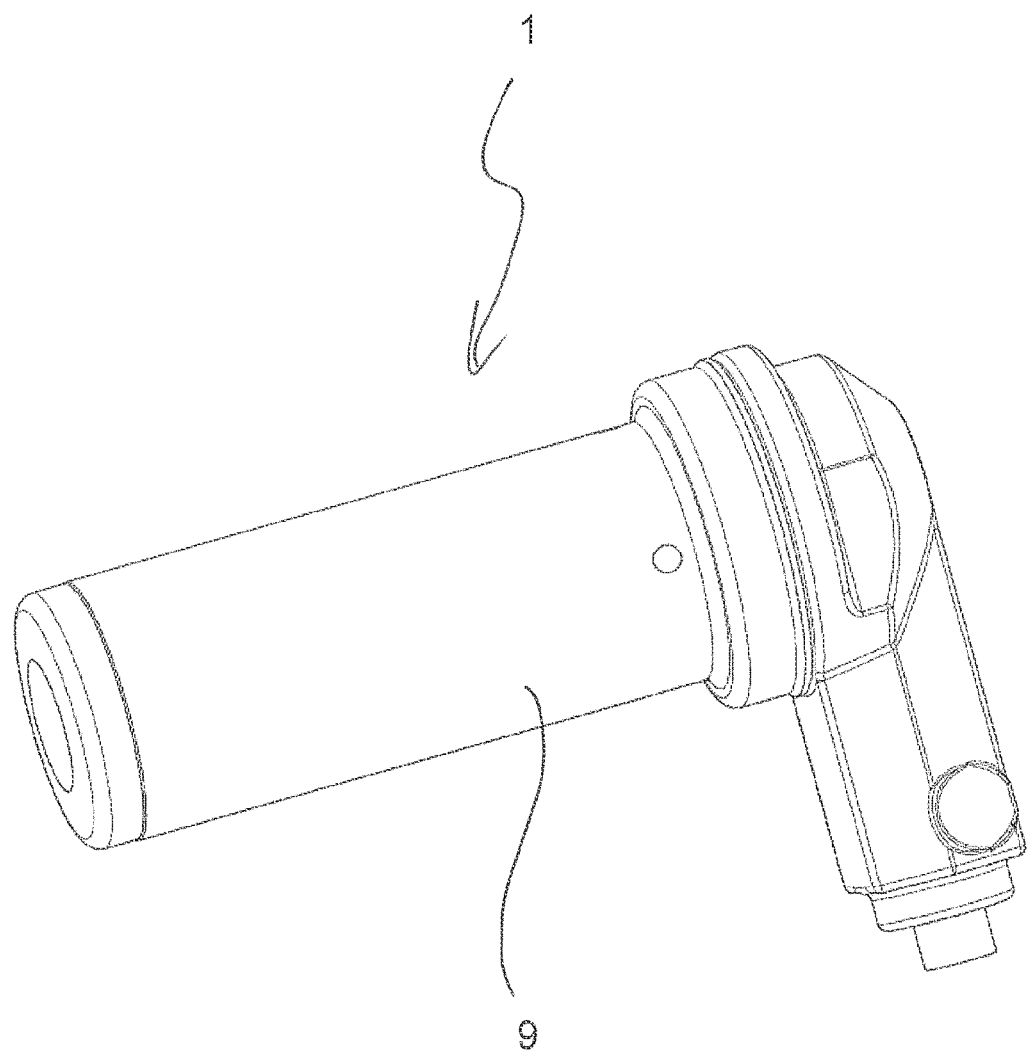
FIG. 3 shows an illustration of the wheel speed sensor of FIG. 2 having installed protective cap.

FIG. 3 shows an overall illustration of the wheel speed sensor 1 of FIG. 2 having installed protective cap 9.

Figure 4:
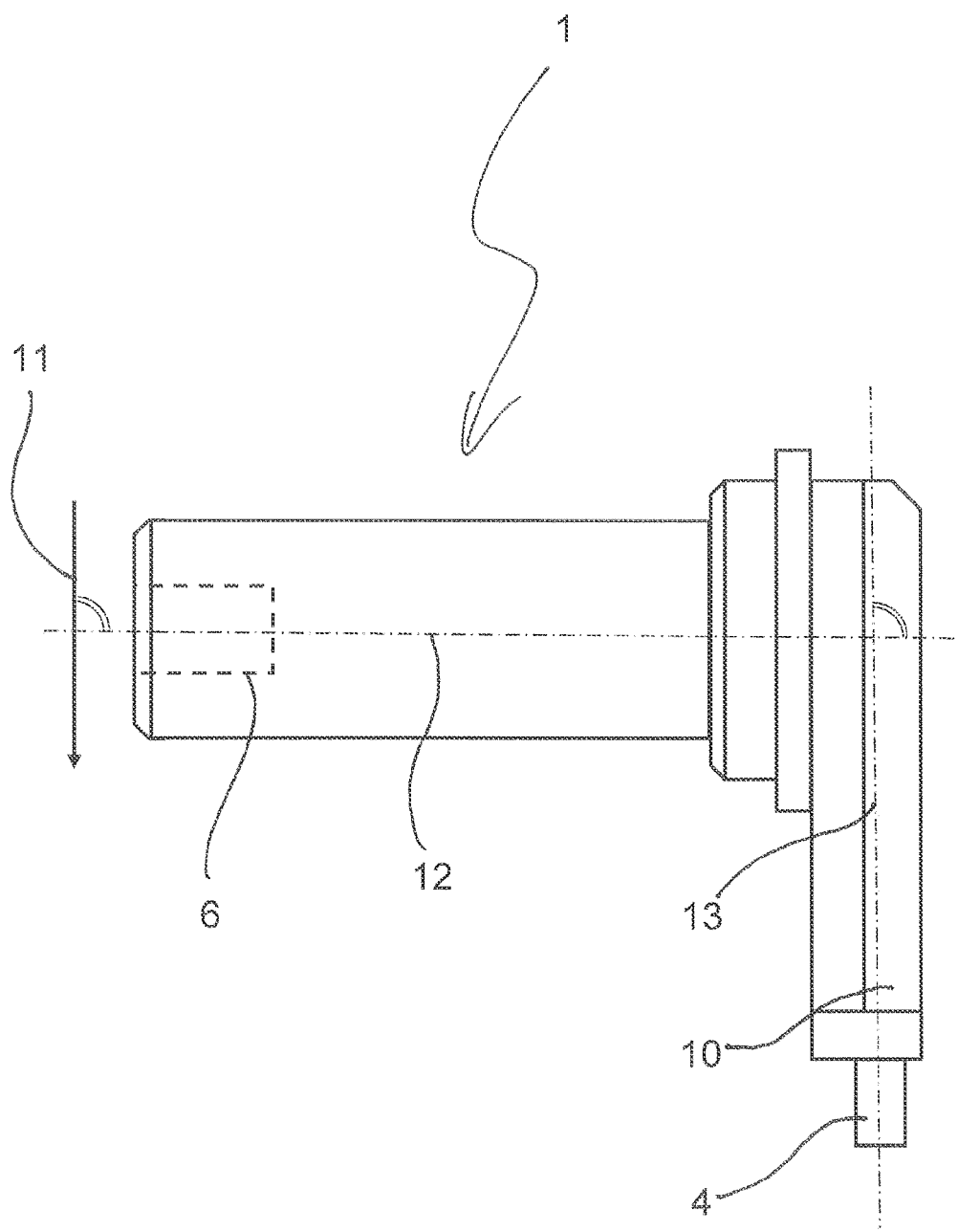
FIG. 4 shows a schematic diagram of a top view of the wheel speed sensor of FIG. 3 to explain a location of an axis of the wheel speed sensor.
Figure 5:
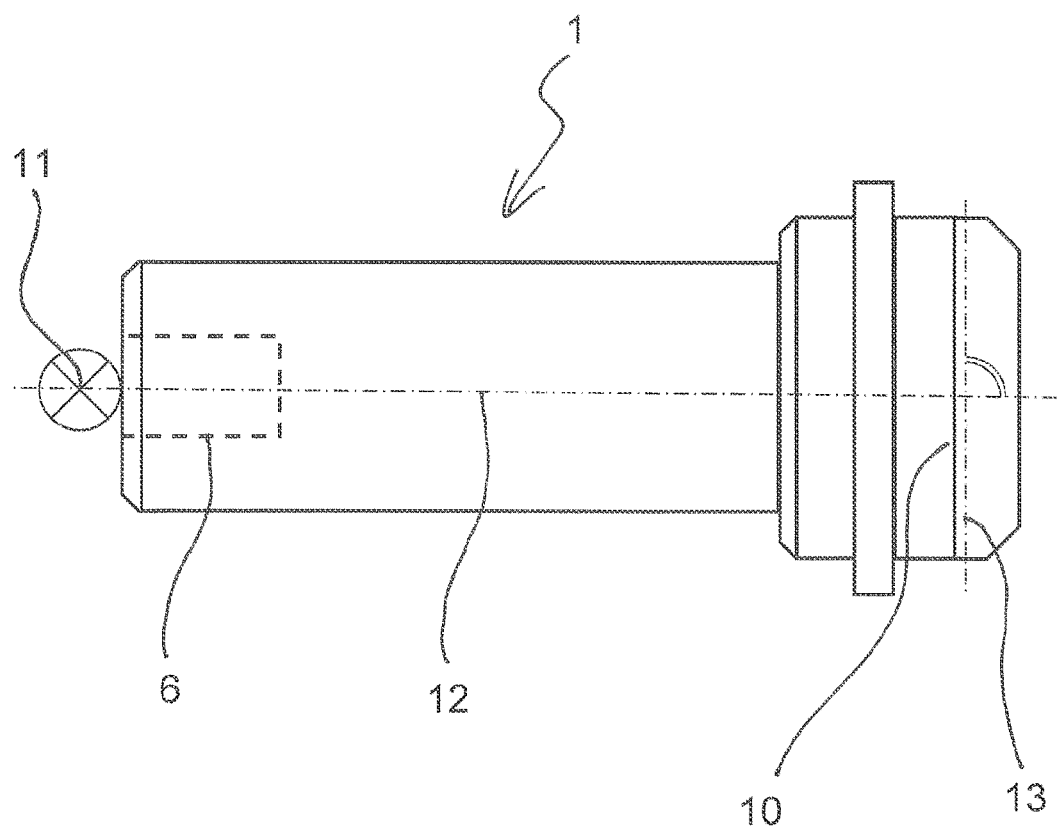
FIG. 5 shows a schematic diagram of a side view of the wheel speed sensor of FIG. 3 to explain a location of an axis of the wheel speed sensor.

FIG. 4 shows a schematic sketch of a top view of the wheel speed sensor of FIG. 3 and FIG. 5 shows a schematic sketch of a side view of the wheel speed sensor of FIG. 3 to explain a location of an axis 12 of the wheel speed sensor 1. The radial cable outlet 10 is integrally formed with the second component 7 so that the cable 4 is led out in a different direction than in the direction of the axis 12. In the exemplary embodiment shown, the cable outlet 10 is led out radially at a right angle to the axis 12. In an alternative embodiment, the cable 4 is not led out at a right angle.

A direction of the axis 12 is defined so that it is aligned perpendicularly to a detection direction 11 of the pulse sensor 6. In the case of an essentially axially-symmetrical oblong wheel speed sensor 1, the axis 12 corresponds to a center axis of the axially-symmetrical oblong wheel speed sensor 1. A plane 13 which is arranged perpendicularly to the axis 12 represents a plane in which the cable 4 exits at different predetermined angles from the housing of the wheel speed sensor 1.

Figure 6:
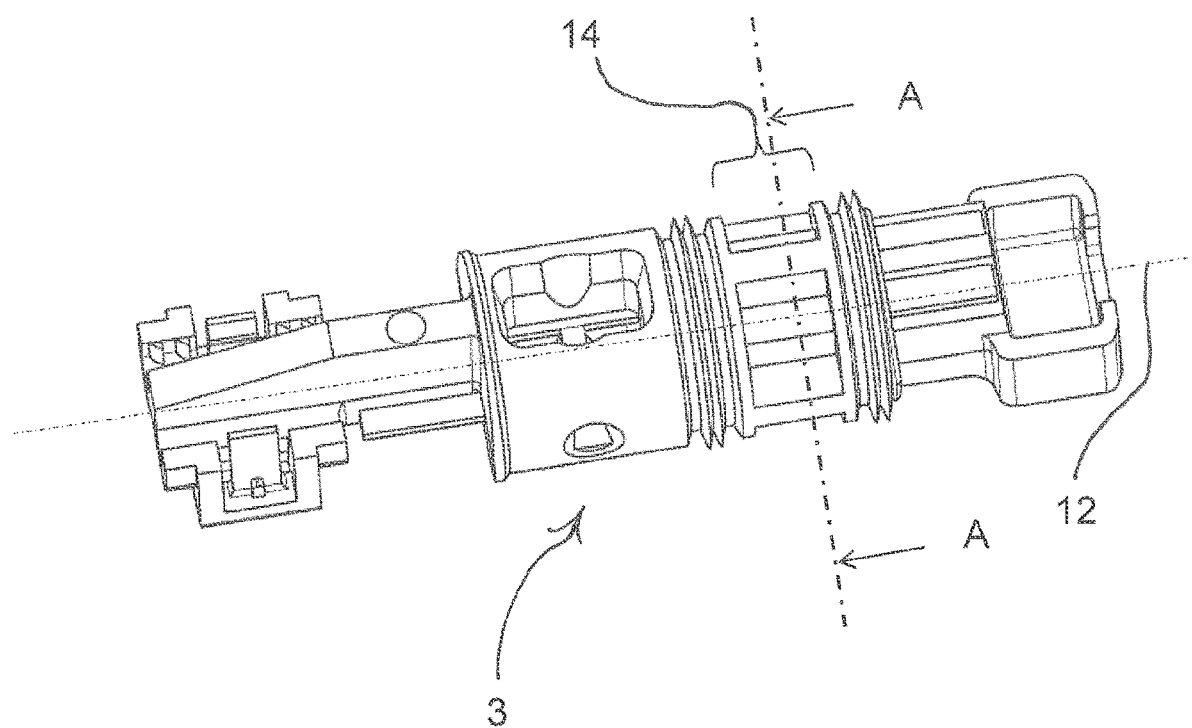
FIG. 6 shows an enlarged illustration of the first component.

FIG. 6 shows an enlarged illustration of the first component 3 having a plane of section which is indicated by the arrows A, A.

Figure 7:
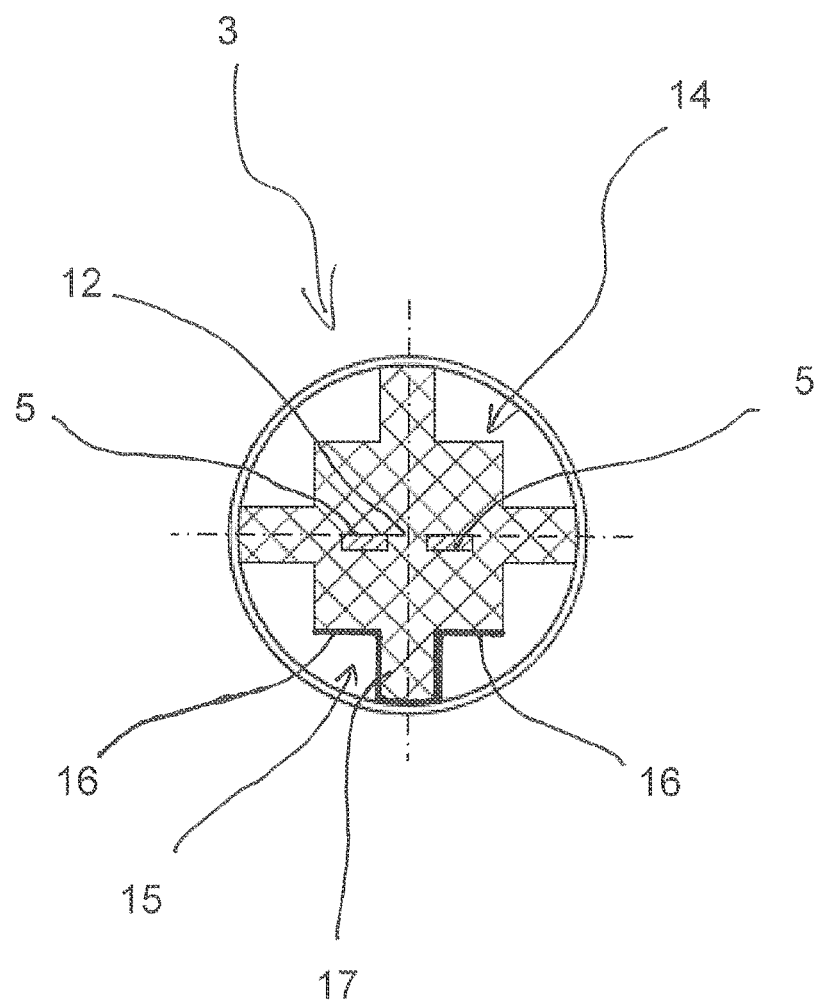
FIG. 7 shows an enlarged illustration of a cross section of the first component at a point of a section A-A in FIG. 6.

FIG. 7 shows an enlarged illustration of a cross section of the first component 3 in the plane of section A-A indicated in FIG. 6, thus in the first region 14. The first region 14 has a contour other than a rotationally-symmetrical contour on its circumference. The circumference is circumferentially stepped and has a shape feature 15 shown by a thick line. The shape feature 15 is formed by a shape feature plane 16 and a shape feature web 17, which protrudes from the shape feature plane 16. The contour has the shape feature 15 at predetermined angle steps around the axis 12. The shape feature 15 is provided periodically here at predetermined angle steps of 90° four times. Alternatively, the shape feature 15 can also be provided in 45° steps, or furthermore alternatively in angle steps of arbitrary sizes, in particular in a range of 80° to 100° or a range of 40° to 50°.

Figure 8:
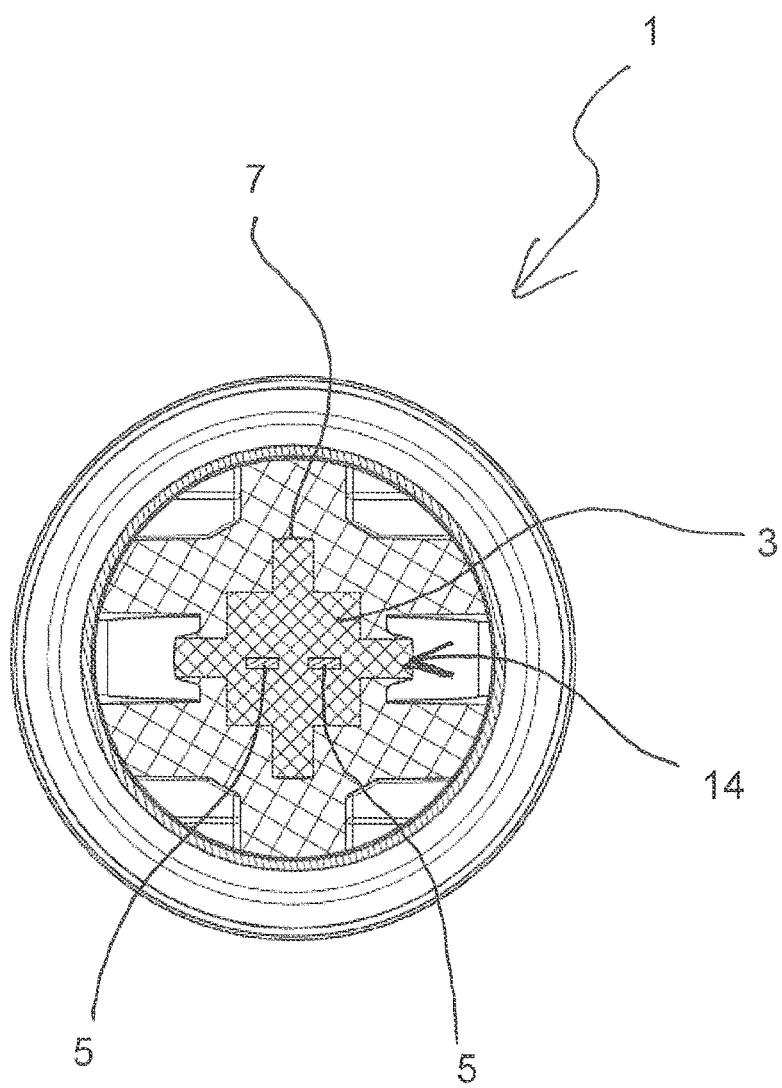
FIG. 8 shows an enlarged illustration of a cross section of the wheel speed sensor of FIG. 3 at a point of a section A-A in FIG. 6.

FIG. 8 shows an enlarged illustration of a cross section of a wheel speed sensor 1 of FIG. 3 at the point of the plane of section A-A in FIG. 6.

FIG. 8 shows a cross section of the first region 14 of the first component 3 and a cross section of a second region of the second component 7, the inner contour of which is formed complementary to the contour on the circumference of the first region 14 of the first component 3. In alternative embodiments, the contours partially correspond complementarily, wherein the shape feature 15 corresponds to a complementary part of the contour of the second region of the second component 7. During the assembly, an orientation of the first component 3 to the second component 7 is thus variably definable in the predetermined angle steps around the axis 12 to provide a predetermined angle around the axis 12 between the detection direction 11 of the pulse sensor 6 and the radial cable outlet 10.

The predetermined angle is provided, as explained hereinafter, during a production of the housing 8 by extrusion coating, by an orientation of the preinstallation assembly 2 in a casting tool. In an alternative production method, in which, for example, the second component 7 consists of two parts, which form the second component 7 by clipping together, which then encloses the first component 3, a corresponding counter shape feature of the second component to the shape feature 15 in the second component 7 can be provided so that the predetermined angle is provided by introducing the shape feature 15 into the counter shape feature of the second component 7.

Furthermore, the busbars 5 in FIG. 7 and FIG. 8 are shown in a state embedded in the first component 3. In alternative embodiments, the busbars are not embedded in the first component 3 but rather fastened in another way on the first component 3.

Furthermore, the busbars are alternatively not necessarily required if the cable 4 is directly connected to the pulse sensor 6.

A production of the wheel speed sensor 1 is explained hereinafter.

First, the preinstallation assembly 2 is produced. For this purpose, the busbars 5 are laid in a first assembly casting tool and then extrusion coated so that the first component 3 having the busbars 5 embedded therein is formed (see also FIGS. 7 and 8).

Subsequently, the cable 4 and the pulse sensor 6 are connected to the busbars 5. This takes place via welding, or alternatively via soldering or another suitable connecting method, for example crimping. The preinstallation assembly is suitable in this state to be used both for the wheel speed sensor 1 having the radial cable outlet 10 and also for the wheel speed sensor 1 having an axial cable outlet.

In an alternative method, the preinstallation assembly 2, for example without the busbars 5, is produced in another way.

Subsequently, the preinstallation assembly 2, which has the first component 3, the pulse sensor 6, and the cable 4, is provided in a second component casting tool for producing the second component 3 including the radial cable outlet 10, in that it is laid in the second component casting tool. The first component 3 is oriented in relation to the second component casting tool by introducing one of the shape features 15 into a corresponding counter shape feature of the second component casting tool so that the desired predetermined angle is defined between the pulse sensor 6 and the radial cable outlet 10 around the axis 12. In the embodiment shown, the shape feature web 17 (FIG. 7) is introduced into a corresponding depression in the second component casting tool.

The orientation of the pulse sensor 6 in the second component casting tool is defined by this alignment. In the embodiment shown, the orientation of the pulse sensor 6 is possible in a 90° grid. Since the second component casting tool has a mold section for the radial cable outlet 10 at a fixed position, the predetermined angle between the pulse sensor 6 and the radial cable outlet 10 around the axis 12 is thus enabled.

The cable 4 is subsequently laid in a receptacle of the second component casting tool, so that the cable 4 is provided in a suitable location to be able to be extrusion coated by casting material, wherein then the radial cable outlet 10 is formed.

The casting material is subsequently poured into the second component casting tool, the first component 3 having the pulse sensor 6 is thus extrusion coated, and the second assembly 7 having the radial cable outlet 10 integrally produced thereon is thus produced.

All features represented in the description, the following claims, and the drawing can be essential to the invention both individually and also in any combination with one another.

THE LIST OF REFERENCE NUMERALS IS AS FOLLOWS 1 wheel speed sensor
2 preinstallation assembly 3 first component
4 cable
5 busbar
6 pulse sensor
7 second component
8 housing
9 protective cap
10 radial cable outlet
11 detection direction
12 axis
13 plane
14 first region
15 shape feature
16 shape feature plane
17 shape feature web

The invention claimed is:

1. A wheel speed sensor for a utility vehicle, comprising:
an active pulse sensor having a pulse generator therein, and a predetermined detection direction;
a first component; and
a second component, wherein the first component and the second component form a housing to at least partially enclose the active pulse sensor;
wherein a movement of the pulse generator in the predetermined detection direction is detectable by the active pulse sensor,
wherein the wheel speed sensor has an axis, wherein a direction of the axis is defined so that it is aligned perpendicularly to the detection direction of the active pulse sensor,
wherein the first component is at least partially enclosed by the second component, by which the first component is at least partially connectable in a formfitting manner,
wherein the active pulse sensor is fastened on the first component,
wherein the wheel speed sensor has a radial cable outlet, which is aligned radially to the axis, and which is configured to lead a cable out of the wheel speed sensor,
wherein the radial cable outlet is integrally formed with the second component so that the cable is led in a different direction than in the direction of the axis,
wherein the first component has a first region in the direction of the axis, which has a contour other than a rotationally-symmetrical contour on its circumference, and the second component has a second region, the inner contour of which is formed at least partially complementary to the contour on the circumference of the first region,
wherein the contour on the circumference of the first region has a shape feature in each of predetermined angle steps around the axis, so that the first component is formed so that an orientation of the first component in relation to the second component is definable in the predetermined angle steps around the axis, to provide a predetermined angle around the axis between the detection direction of the active pulse sensor and the radial cable outlet, and
wherein the first component is formed as a plastic molded part, and the second component is formed by encapsulating the first component with a plastic.

2. The wheel speed sensor of claim 1, wherein the active pulse sensor has an AMR sensor.

3. The wheel speed sensor of claim 1, wherein the first component and the second component include an identical material.

4. The wheel speed sensor of claim 1, wherein the first component has a first region having a contour that is circumferentially stepped and having a shape feature, wherein the contour has the shape feature at predetermined angle steps around an axis, and wherein the predetermined angle steps are in a range of 80° to 100°.

5. The wheel speed sensor of claim 1, wherein the first component has a first region having a contour that is circumferentially stepped and having a shape feature, wherein the contour has the shape feature at predetermined angle steps around an axis, and wherein the predetermined angle steps are in a range of 40° to 50°.

* * * * *